(12) United States Patent
Lee

(10) Patent No.: US 7,692,752 B2
(45) Date of Patent: Apr. 6, 2010

(54) FLEXIBLE MEMBER AND LIQUID CRYSTAL DISPLAY DEVICE HAVING THE SAME

(75) Inventor: Yong-soon Lee, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 11/888,434

(22) Filed: Jul. 31, 2007

(65) Prior Publication Data
US 2008/0030667 A1     Feb. 7, 2008

(30) Foreign Application Priority Data
Aug. 3, 2006     (KR) .................... 10-2006-0073442

(51) Int. Cl.
*G02F 1/1345* (2006.01)
(52) U.S. Cl. .................................. 349/150; 349/149
(58) Field of Classification Search .......... 349/147–150
See application file for complete search history.

(56) References Cited

U.S. PATENT DOCUMENTS 6,064,459 A     5/2000   Lee
6,292,237 B1    9/2001   Hebiguchi
2002/0063703 A1* 5/2002  Furuhashi et al. ........... 345/212
2005/0162605 A1 7/2005   Murade
2005/0253836 A1 11/2005  Kim et al.
2006/0164586 A1* 7/2006  Yamada ...................... 349/149

FOREIGN PATENT DOCUMENTS

JP     2000-330518     11/2000

OTHER PUBLICATIONS

English Language Abstract, Publication No. JP2000330518, Nov. 30, 2000, 1 p.

* cited by examiner

*Primary Examiner*—Frank G Font
*Assistant Examiner*—Eric Wong
(74) *Attorney, Agent, or Firm*—Innovation Counsel LLP

(57) ABSTRACT

A flexible member that is configured to be connected with a liquid crystal display panel comprising a common electrode, a gate line, and a data line intersecting the gate line, includes a flexible film, a data lead that is formed on the flexible film and is connected with the data line, first and second application leads that are formed on the flexible film and apply a common voltage to the common electrode, with the data lead located between the first and second application leads, and a feedback lead that is formed on the flexible film and feedbacks the common voltage applied to the common electrode.

20 Claims, 13 Drawing Sheets

FLEXIBLE MEMBER AND LIQUID CRYSTAL DISPLAY DEVICE HAVING THE SAME

CROSS-REFERENCE TO RELATED APPLICATIONS

This application claims priority from Korean Patent Application No. 10-2006-0073442, filed on Aug. 3, 2006, the disclosure of which is incorporated herein by reference in its entirety.

BACKGROUND OF THE INVENTION

1. Field of the Invention

The present invention relates to a flexible member and a liquid crystal display device having the same.

2. Description of the Related Art

A liquid crystal display (LCD) device comprises a liquid crystal display panel comprising a first substrate on which thin film transistors (TFTs) are formed, a second substrate facing the first substrate, and a liquid crystal layer interposed between both substrates.

Liquid crystal molecules in the liquid crystal layer aligned by an electric field formed between a pixel voltage applied to the first substrate and a common voltage applied to the second substrate.

The pixel voltage and the common voltage are supplied to the first and second substrates, respectively, through a circuit board and a flexible member, which are connected to the liquid crystal display panel. The flexible member is formed with leads through which the pixel voltage and the common voltage, which are outputted from the circuit board, are transmitted to the liquid crystal display panel.

The pixel voltage alternates between a positive polarity and a negative polarity with respect to the common voltage. However, if the pixel voltage is biased to one of the positive and negative polarities, the common voltage may be distorted, which results in deterioration of image quality.

The pixel voltage needs to be compensated for to avoid the distortion of the common voltage. However, as a structure of an LCD device becomes simple, it becomes difficult to provide the flexible member with an arrangement for supply and compensation of the pixel voltage.

SUMMARY OF THE INVENTION

Accordingly, it is an aspect of the present invention to provide a flexible member allowing efficient supply and compensation of a common voltage.

It is another aspect of the present invention to provide a liquid crystal display device allowing efficient supply and compensation of a common voltage.

The foregoing and/or other aspects of the present invention can be achieved by providing a flexible member that is configured to be connected with a liquid crystal display panel comprising a common electrode, a gate line, and a data line intersecting the gate line, comprising: a flexible film; a data lead that is formed on the flexible film and is connected with the data line; first and second application leads that are formed on the flexible film and apply a common voltage to the common electrode, with the data lead located between the first and second application leads; and a feedback lead that is formed on the flexible film and feedbacks the common voltage applied to the common electrode.

According to the embodiment of the present invention, each of the first and second application leads has a plurality of common voltage supply paths.

According to the embodiment of the present invention, the feedback lead comprises first and second feedback leads, with the data lead located between the first and second feedback leads.

According to the embodiment of the present invention, the flexible member further comprises a driving chip that is mounted on the flexible film and is connected to the data lead.

According to the embodiment of the present invention, the flexible member further comprises a gate lead that is formed on the flexible film and is connected to the gate line.

According to the embodiment of the present invention, the gate lead comprises: a first gate lead that is formed between the data lead and the first application lead; and a second gate lead that is formed between the data lead and the second application lead.

The foregoing and/or other aspects of the present invention can be achieved by providing a liquid crystal display device comprising: a liquid crystal display panel comprising a common electrode, a gate line, and a data line interesting the gate line; and a flexible member that is connected to the liquid crystal display panel, the flexible member comprising: a flexible film; a data lead that is formed on the flexible film and is connected with the data line; first and second application leads that are formed on the flexible film and apply a common voltage to the common electrode, with the data line located between the first and second application leads; and a feedback lead that is formed on the flexible film and feedbacks the common voltage applied to the common electrode.

According to the embodiment of the present invention, the liquid crystal display panel comprises: a first substrate on which the gate line and the data line are formed; and a second substrate on which the common electrode is formed, the second substrate facing the first substrate, and wherein the flexible member is connected to the first substrate and is provided as single.

According to the embodiment of the present invention, the feedback lead comprises first and second feedback leads, with the data lead located between the first and second feedback leads.

According to the embodiment of the present invention, each of the first and second application leads has a plurality of common voltage supply paths.

According to the embodiment of the present invention, the first substrate comprises a shift register that is provided at an end part of the gate line and transmits a driving signal to the gate line, and the flexible member further comprises a gate lead that is connected to the shift register.

According to the embodiment of the present invention, the first substrate further comprises a pixel electrode that is electrically connected to the gate line and the data line, the shift register comprises first and second shift registers, with the pixel electrode located between the first and second shift registers, and the gate lead comprises: a first gate lead that is formed between the data lead and the first application lead and is connected to the first shift register; and a second gate lead that is formed between the data lead and the second application lead and is connected to the second shift register.

According to the embodiment of the present invention, the pixel electrode comprises first, second and third pixel electrodes that constitute one pixel, and the first, second and third pixel electrodes are connected to different gate lines.

According to the embodiment of the present invention, two of the first, second and third pixel electrodes are connected to the same data line.

According to the embodiment of the present invention, the first, second and third pixel electrodes are sequentially driven.

According to the embodiment of the present invention, the flexible member further comprises a driving chip that is mounted on the flexible film and is connected to the data lead.

According to the embodiment of the present invention, the liquid crystal display device further comprises a driving chip that is mounted on the first substrate and is connected to the data lead.

The foregoing and/or other aspects of the present invention can be achieved by providing a liquid crystal display device comprising: a first substrate comprising a pixel electrode, a gate line, and a data line intersecting the gate line; a second substrate on which a common electrode is formed, the second substrate facing the first substrate; and a flexible member that is connected to the first substrate, the flexible member being provided as single and is connected to the data line, and the first substrate further comprising: a data pad that is connected with the data line; first and second application pads that receive a common voltage from the flexible member, with the data pad located between the first and second application pads; and first and second feedback pads to which the common voltage is fed-back, with the data pad located between the first and second feedback pads.

According to the embodiment of the present invention, the first substrate further comprises: first and second shift registers that are provided at an end part of the gate line and transmits a driving signal to the gate line, with the pixel electrode located between the first and second shift registers; and first and second gate pads that receive a gate driving signal from the flexible member and apply the received gate driving signal to the first and second shift registers, respectively, wherein the first gate pad is formed between the data pad and the first application pad and the second gate pad is formed between the data pad and the second application pad.

According to the embodiment of the present invention, the pixel electrode comprises first, second and third pixel electrodes that constitute one pixel, and the first, second and third pixel electrodes are connected to different gate lines.

According to the embodiment of the present invention, two of the first, second and third pixel electrodes are connected to the same data line.

According to the embodiment of the present invention, the first, second and third pixel electrodes are sequentially driven.

BRIEF DESCRIPTION OF THE DRAWINGS

The above and other aspects and advantages of the present invention will become apparent and more readily appreciated from the following description of the embodiments, taken in conjunction with the accompanying drawings of which.

DETAILED DESCRIPTION OF THE INVENTION

Figure 1:
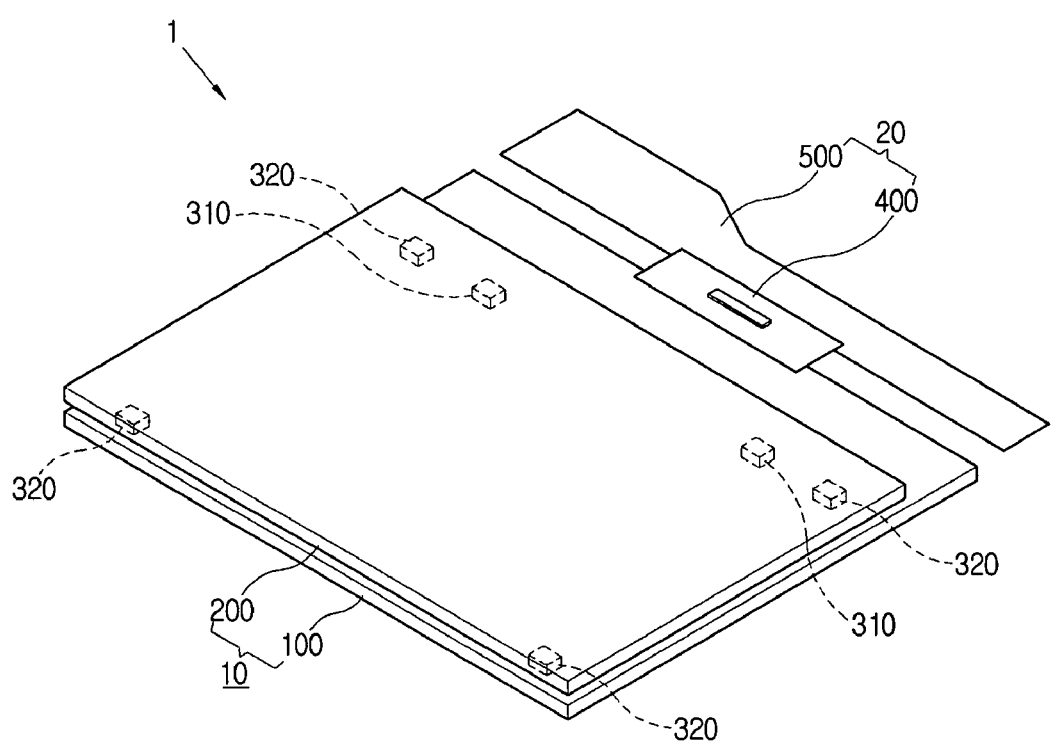
FIG. 1 is a perspective view of a liquid crystal display device according to a first embodiment of the present invention.

Reference will now be made in detail to exemplary embodiments of the present invention, examples of which are illustrated in the accompanying drawings, wherein like reference numerals refer to like elements throughout. The embodiments are described below to explain the present invention by referring to the figures.

The like elements will be described for a first exemplary embodiment and may not be further described for other embodiments.

As shown in FIG. 1, a liquid crystal display device 1 according to a first embodiment comprises a liquid crystal display panel 10 and a driving part 20.

The liquid crystal display panel 10 comprises a first substrate 100 and a second substrate 200, which are combined together. The first substrate 100 is provided to be somewhat larger than the second substrate 200. The liquid crystal display panel 10 comprises feedback shorting bars 310 and application shorting bar 320 that electrically connect the first substrate 100 to the second substrate 200.

The driving part 20 comprises a flexible member 400 and a circuit board 500. The flexible member 400 connects the liquid crystal display panel 10 to the circuit board 500. The flexible member 400 is connected to an end part of the first substrate 100.

Figure 2:
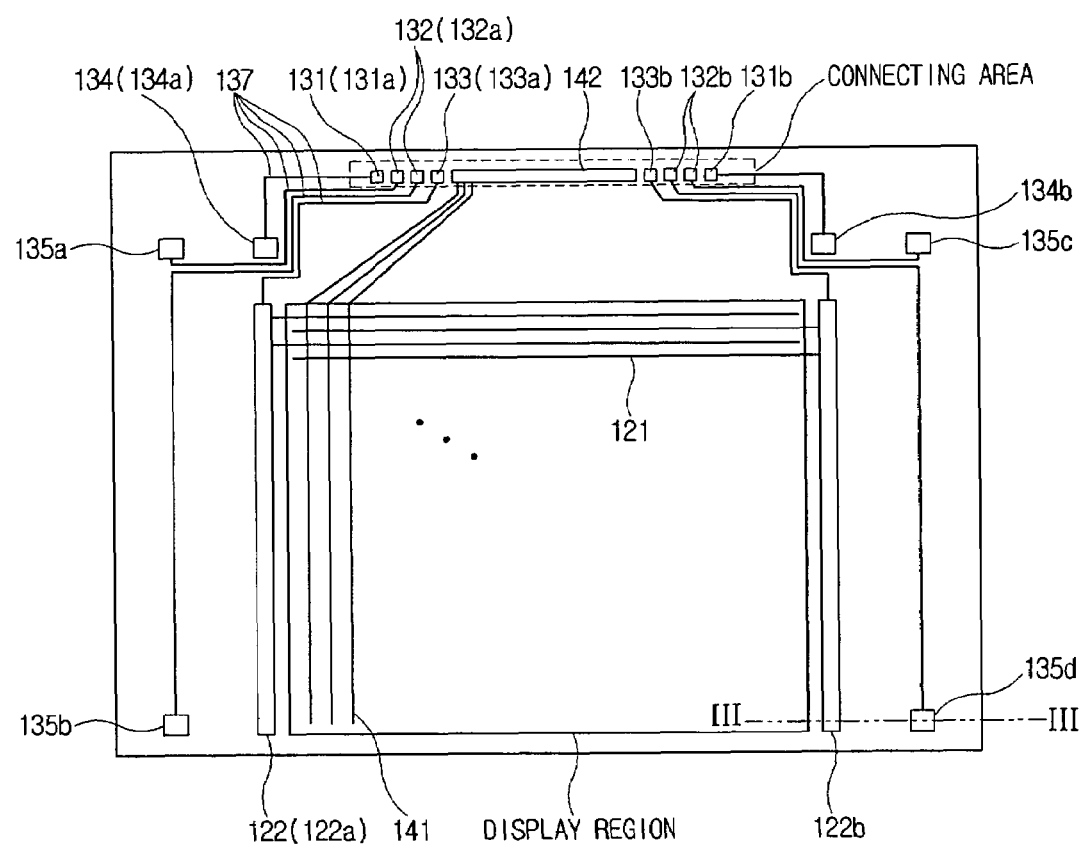
FIG. 2 shows a layout of the first substrate 100 according to the first embodiment of the present invention.

Now, the liquid crystal display panel 10 will be described in more detail with reference to FIGS. 2 to 4.

The liquid crystal display panel 10 is divided into a display region and a non-display region surrounding the display region.

First, considering the display region, gate lines 121 and data lines 141 intersecting the gate lines 121 are formed on a first insulating substrate 110. Thin film transistors 150 are formed at intersections of the gate lines 121 and the data lines 141. The thin film transistors 150 are electrically connected to the gate lines 121 and the data lines 141.

A passivation layer 160 is formed on the thin film transistors 150. Contact holes 161 to expose the thin film transistors 150 are formed in the passivation layer 160.

Pixel electrodes 171 made of transparent material are connected to the thin film transistors 150 via the contact holes 161. The pixel electrodes 171 have a rectangular shape extending along the gate lines 121.

Three pixel electrodes 171 arranged adjacent to each other in an extension direction of the data lines 141 constitutes one pixel. The three adjacent pixel electrodes 171 constituting one pixel are connected to different gate lines 121. The pixel electrodes 171 are alternately connected to left data lines 141 and right data lines 141 along the extension direction of the data lines 141.

In the prior art, the three pixel electrodes 171 constituting one pixel are arranged along an extension direction of the gate lines 121 and are connected to different gate lines 121. According to the present invention, the number of gate lines 121 increases to three fold and the number of data lines 141 decreases to ⅓, compared to the prior art.

Inner black matrixes 220 corresponding to the thin film transistors 150 are formed on a second insulating substrate 210. Color filters 230 are formed between the inner black matrixes 220. An overcoat layer 240 and a common electrode 250 are sequentially formed on the color filters 230.

Next, considering the non-display region, shift registers denoted by reference characters 122, 122a and 122b are connected to the gate lines 121 are formed in non-display regions located in the left and right sides of the display region. The shift registers 122 drive the gate lines 121 by applying a gate ON voltage and a gate OFF voltage to the gate lines 121.

The shift registers 122 comprise first shift registers 122a located in the left side of the display region and second shift registers 122b located in the right side of the display region. Referring to FIG. 4, odd-numbered gate lines 121 are connected to the first shift registers 122a and even-numbered gate lines 121 are connected to the second shift registers 122b. Although not shown, the first shift registers 122a are electrically interconnected and the second shift registers 122b are also electrically interconnected.

In general, a circuit that drives the data lines 141 is more complicated and expensive than a circuit that drives the gate lines 121. According to the present invention, the number of data lines 141 decreases to ⅓, the number used in the prior art, leading to reduction of a scale of the circuit that drives the data lines 141 and hence reduction of production costs.

Unlike the data lines 141, the number of gate lines 121 increases three fold, leading to increase of a cost of the circuit that drives the gate lines 121. However, according to the present invention, since the gate lines 121 are driven by the shift registers 122 formed on the first insulating substrate 110, the circuit cost does not increase.

On the other hand, the pixel electrodes 171 extend along the gate lines 121 and intervals between the gate lines 121 are reduced. Accordingly, a space in which the shift registers 122 are formed is limited. However, according to the present invention, since the shift registers 122 are provided on both sides of the display region separately, a space for the shift registers 122 can be reserved without difficulty.

Figure 5:
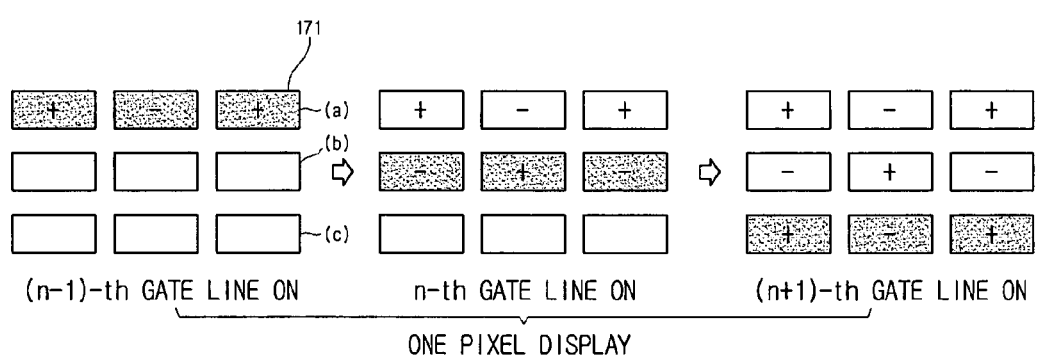
FIG. 5 is a view for explaining a driving method of the liquid crystal display device according to the first embodiment of the present invention.

Now, an operation of the liquid crystal display device 1 will be described with reference to FIG. 5.

When a gate ON voltage is applied to a (n−1)-th gate line 121, the thin film transistor 150 connected to the (n−1)-th gate line 121 is turned on. Then, pixel electrodes 171 in a row (a) connected to the (n−1)-th gate line 121 are turned on.

Thereafter, when a gate ON voltage is applied to a n-th gate line 121, pixel electrodes 171 in a row (b) connected to the n-th gate line 121 are turned on.

In the same way, when a gate ON voltage is applied to a (n+1)-th gate line 121, pixel electrodes 171 in a row (c) connected to the (n+1)-th gate line 121 are turned on. Thus, display for one pixel is completed. For display of one pixel, three gate lines 121 are sequentially driven and the data lines 141 supply data voltages corresponding to the pixel electrodes 171 in accordance with driving of the gate lines 121.

At this time, a polarity of a voltage applied to the pixel electrodes 171 is controlled to be dot inversion.

As described above, the three pixel electrodes constituting one pixel are driven not simultaneously but sequentially. Also, one pixel is represented by three gate ON signals.

Returning to FIGS. 2 to 4, the non-display region is again considered.

Of a non-display region above the display region, a connecting area connected to the flexible member 400 has feedback pads 131, application pads 132, gate pads 133 and a data pad 142.

The feedback pads 131 are located in the outermost of the connecting area and comprise a first feedback pad 131a and a second feedback pad 131b, which are respectively formed on opposite sides of the data pad 142.

The application pads 132 are located between the feedback pads 131 and the gate pads 133 and comprise first application pads 132a and second application pads 132b, which are respectively formed on opposite sides of the data pad 142. The application pads 132a and 132b are respectively provided in pairs to have a plurality of voltage application paths.

The gate pads 133 face the data pad 142 and comprise a first gate pad 133a and a second gate pad 133b, which are respectively formed on opposite sides of the data pad 142.

In addition, feedback shorting bar pads 134 and application shorting bar pads 135 are formed in the outer side of the display region.

The feedback shorting bar pads 134 comprise a first feedback shorting bar pad 134a located on a left upper side of the display region and a second feedback shorting bar pad 134b located on a right upper side of the display region.

The application shorting bar pads 135 comprise a first application shorting bar pad 135a located on a left upper side of the display region, a second application shorting bar pad 135b located on a left lower side of the display region, a third application shorting bar pad 135c located on a right upper side of the display region, and a fourth application shorting bar pad 135d located on a right lower side of the display region.

Hereinafter, electrical connection between the above-mentioned elements will be described. In the first embodiment, left and right parts of the first substrate 100 are symmetric to each other and an electrical connection of the left side will be explained.

The first feedback pad 131a is connected to the first feedback shorting bar pad 134a. One of the pair of first application pads 132a is connected to the first application shorting bar pad 135a and the other is connected to the second application shorting bar pad 135b. The first gate pad 133a is connected to the first shift registers 122a and the data pad 142 is connected to the data lines 141.

The feedback shorting bar pads 134 are connected to feedback shorting bars 310 via contact members 172, and the feedback shorting bars 310 are connected to the common electrode 250 (partially shown in FIG. 1). The contact members 172 may be made of the same transparent conductive material as the pixel electrodes 171.

The application shorting bar pads 135 are connected to application shorting bars 320, and the application shorting bars 320 are connected to the common electrode 250.

Figure 3:
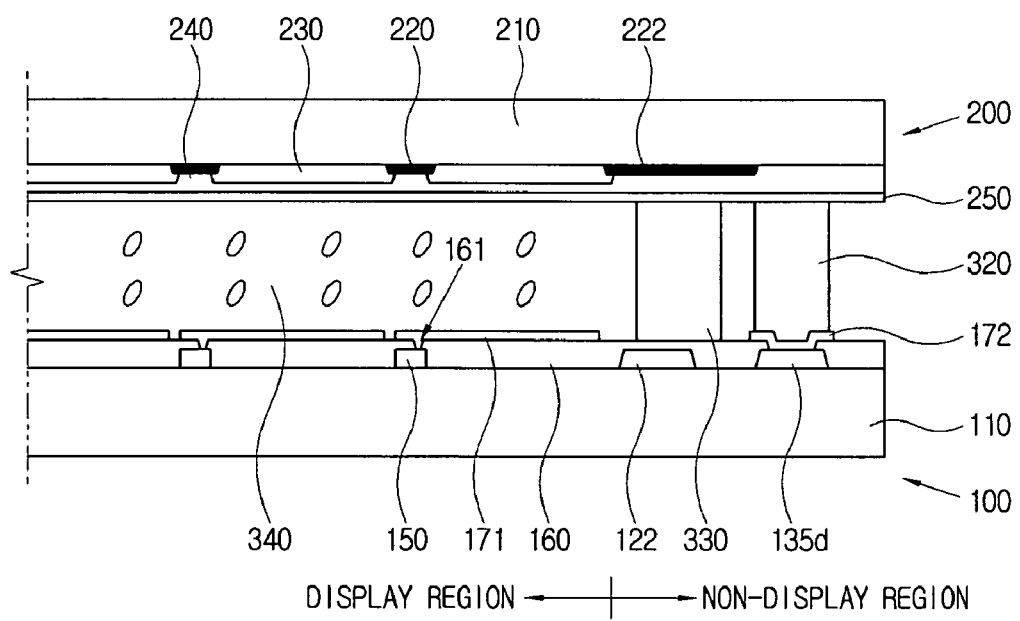
FIG. 3 is a sectional view taken along line III-III in FIG. 2 showing a portion of first substrate 100 and second substrate 200 in an assembled configuration.
Figure 4:
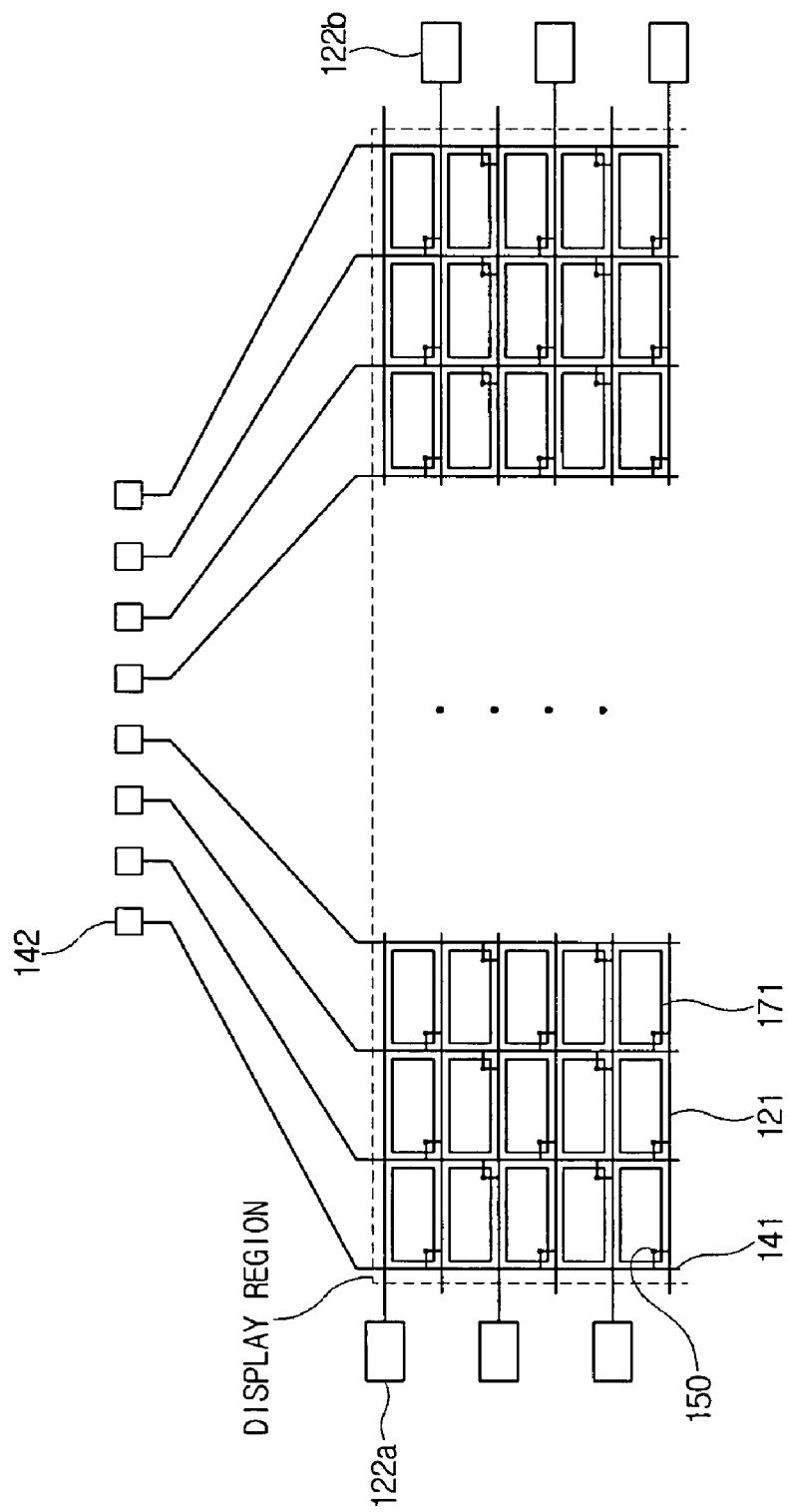
FIG. 4 is a view showing connections between pixel electrodes and wiring lines in the liquid crystal display device according to the first embodiment of the present invention.

As shown in FIG. 3, the first and second substrates 100 and 200 are attached together by sealant 330, and a liquid crystal layer 340 is formed in a space defined by the first and second substrates 100 and 200 and the sealant 330.

Connecting wiring lines 137 of the first substrate 100 in the liquid crystal display panel 10 electrically interconnect the above-mentioned elements. An outer black matrix 222 of the second substrate 200 is formed along the circumference of the second substrate 200.

Figure 6:
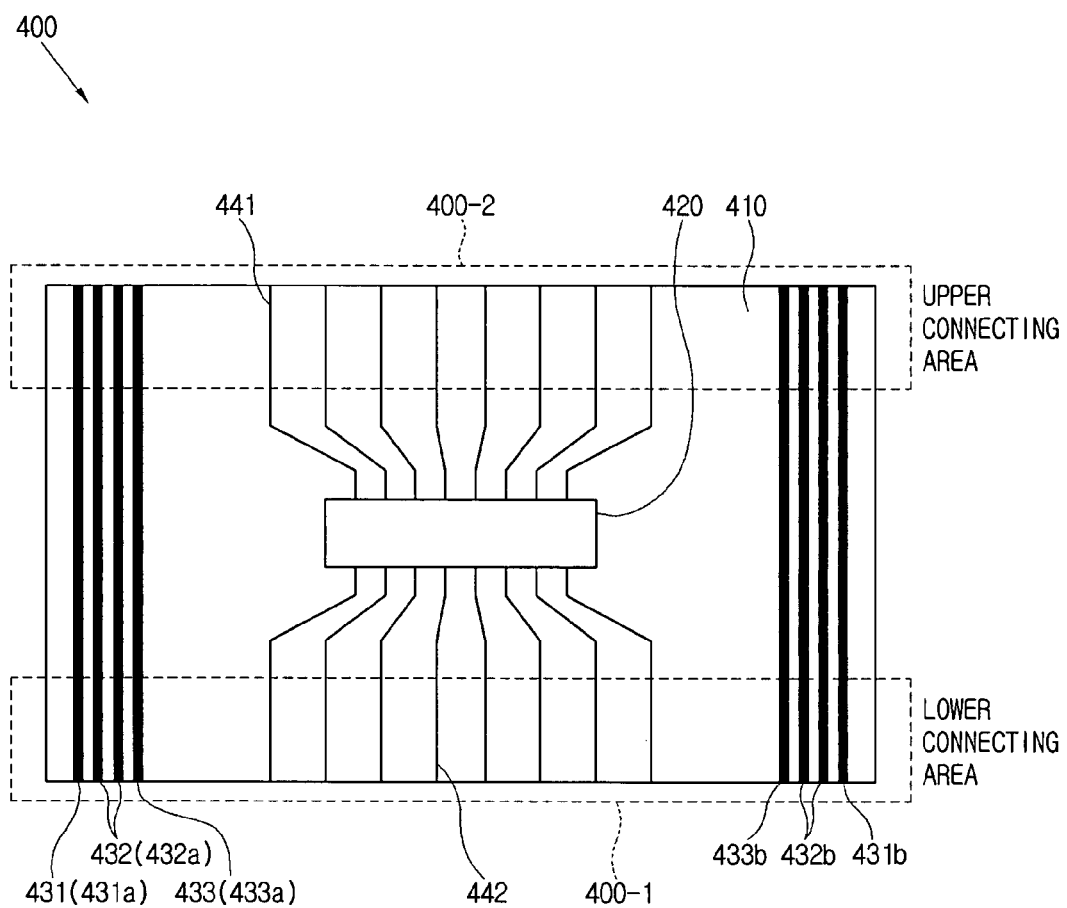
FIG. 6 is a plan view of a flexible member for use in the first embodiment of the present invention.

Now, the flexible member 400 will be described with reference to FIG. 6.

The flexible member 400 comprises a flexible film 410, a driving chip 420, and leads 431, 432, 433, 441 and 442 formed on the flexible film 410.

The flexible film 410 may be made of flexible plastic.

The driving chip 420 is mounted on the flexible film 410 and is connected to first data leads 441 and second data leads 442. The first data leads 441 are connected to the circuit board 500 and the second data leads 442 are connected to the data pad 142.

In this embodiment, the flexible member 400 is provided as single unit and is connected to the overall data pad 142. When the flexible member 400 is provided as single unit, production costs of the liquid crystal display device may be reduced.

Feedback leads 431, application leads 432 and gate leads 433 are symmetrically formed around the data leads 441 and 442.

The feedback leads 431 are located in the outermost of the flexible film 410 and comprise a first feedback lead 431a and a second feedback lead 431b, which are formed on opposite sides of the data leads 441 and 442.

The application leads 432 are located between the feedback leads 431 and the gate leads 433 and comprise first application leads 432a and second application leads 432b, which are formed on opposite sides of the data leads 441 and 442. The first and second application leads 432a and 432b are respectively provided in a pair to provide a plurality of voltage application paths.

The gate leads 433 are immediately adjacent the data leads 441 and 442 and comprise a first gate lead 433a and a second gate lead 433b, which are formed on opposite sides of the data leads 441 and 442.

A lower connecting area 400-1 of the flexible member 400 is connected to the connecting area of the first substrate 100, and an upper connecting area 400-2 of the flexible member 400 is connected to the circuit board 500. When flexible member 400 is connected to, the first substrate 100, the feedback leads 431 are connected to the feedback pads 131, the application leads 432 are connected to the application pads 132, the gate leads 433 are connected to the gate pads 133, and the second data leads 442 are connected to the data pad 142. Although not shown, an anisotropic conductive film may be used for the above-described connection.

A gate driving signal applied to the gate leads 433 is transmitted to the shift registers 122 via the gate pads 133 and the connecting wiring lines 137.

A data driving signal applied to the second data leads 442 is transmitted to the data lines 141 via the data pad 142.

Now, application and compensation of a common voltage using the flexible member 400 according to the first embodiment will be described.

A common voltage applied from the circuit board 500 through the flexible member 400 is transmitted to the liquid crystal display panel 10 via the application leads 432 and the application pads 132. The common voltage transmitted to the application pads 132 is applied to the common electrode 250 via the connecting wiring lines 137, the application shorting bar pads 135 and the application shorting bars 320. The common voltage is transmitted via four paths and is simultaneously applied to four corners of the common electrode 250 which is located on second substrate 200.

The magnitude of the common voltage on common electrode 250 is transmitted to the feedback leads 431 of the flexible member 400 via the feedback shorting bars 310, the feedback shorting bar pads 134, the connecting wiring lines 137 and the feedback pads 131.

The fed-back common voltage is transmitted to a common voltage application part (not shown). The common voltage application part adjusts the magnitude of applied common voltage based on the fed-back common voltage. The common voltage application part may be provided in the circuit board 500.

According to the above-described first embodiment, the common voltage application and the common voltage feedback using the single flexible member 400 can be performed. In particular, since the common voltage is simultaneously applied to the four corners of the common electrode 250, the common electrode 250 can maintain the common voltage stably. In addition, the gate lines 121 and the data lines 141 can be driven only by the single flexible member 400.

Hereinafter, a liquid crystal display device 1 according to a second embodiment of the present invention will be described with reference to FIGS. 7 and 8.

Figure 7:
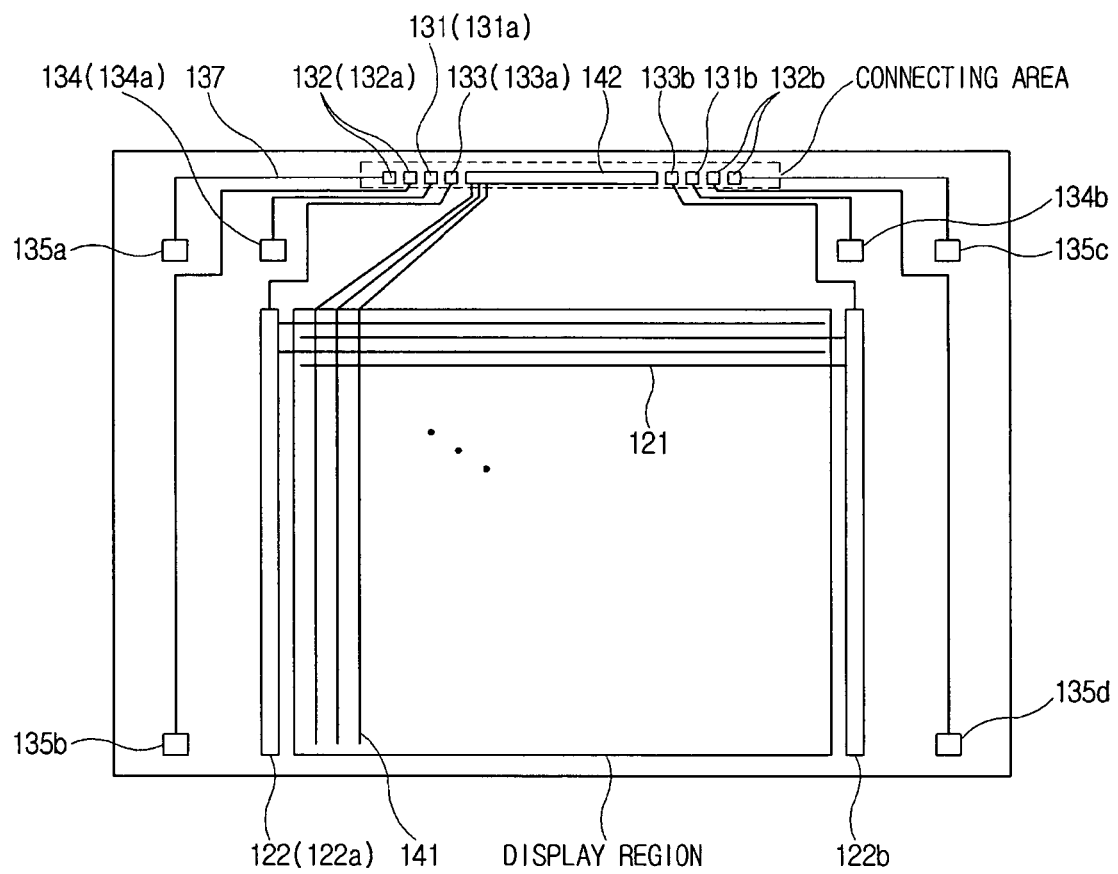
FIG. 7 shows a layout of a first substrate according to a second embodiment of the present invention.

In the second embodiment illustrated in FIG. 7, application pads 132 are located in the outer most of the connecting area in a first substrate 100, and feedback pads 131 are located between application pads 132 and gate pads 133.

Figure 8:
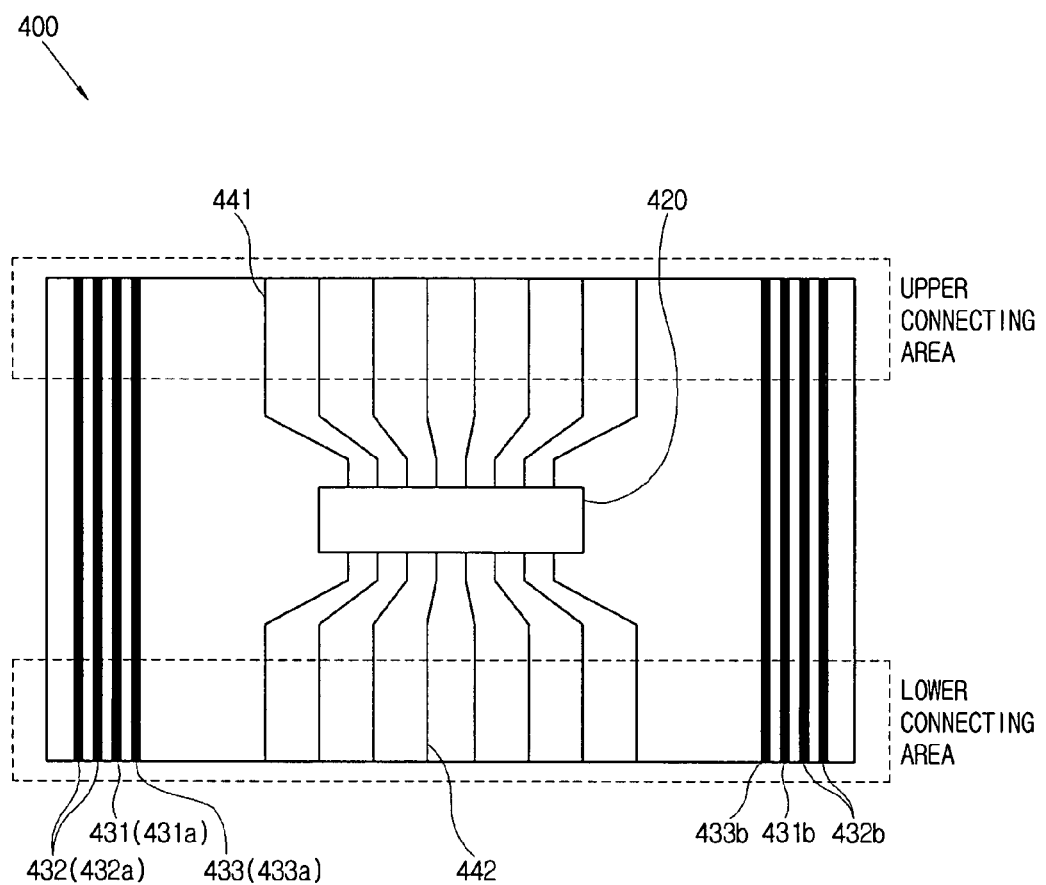
FIG. 8 is a plan view of a flexible member for use in the second embodiment of the present invention.

As shown in FIG. 8, the structure of a flexible member 400 is changed to correspond to the changed layout of the first substrate 100. Specifically, application leads 432 are located in the outermost of the lower connecting area, and feedback leads 431 are located between the application leads 432 and the gate leads 433.

Figure 9:
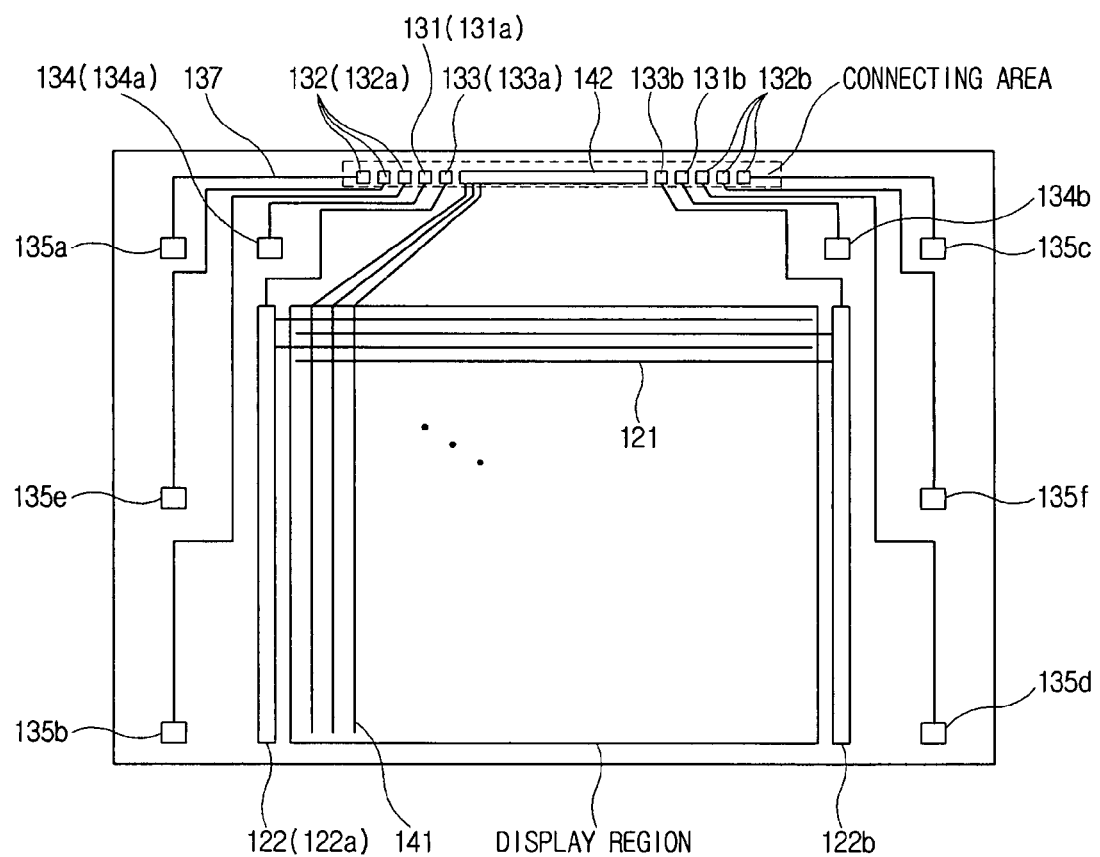
FIG. 9 shows a layout of a first substrate according to a third embodiment of the present invention.

Hereinafter, a liquid crystal display device 1 according to a third embodiment of the present invention will be described with reference to FIGS. 9 and 10.

Three first application pads 132a and three second application pads 132b are arranged in a first substrate 100. In addition, six application shorting bar pads 135a, 135b, 135c, 135d, 135e and 135f are connected to the application pads 132a and 132b. The fifth application shorting bar pad 135e is located in the left middle portion of the display region, and the sixth application shorting bar pad 135f is located in the right middle portion of the display region.

Figure 10:
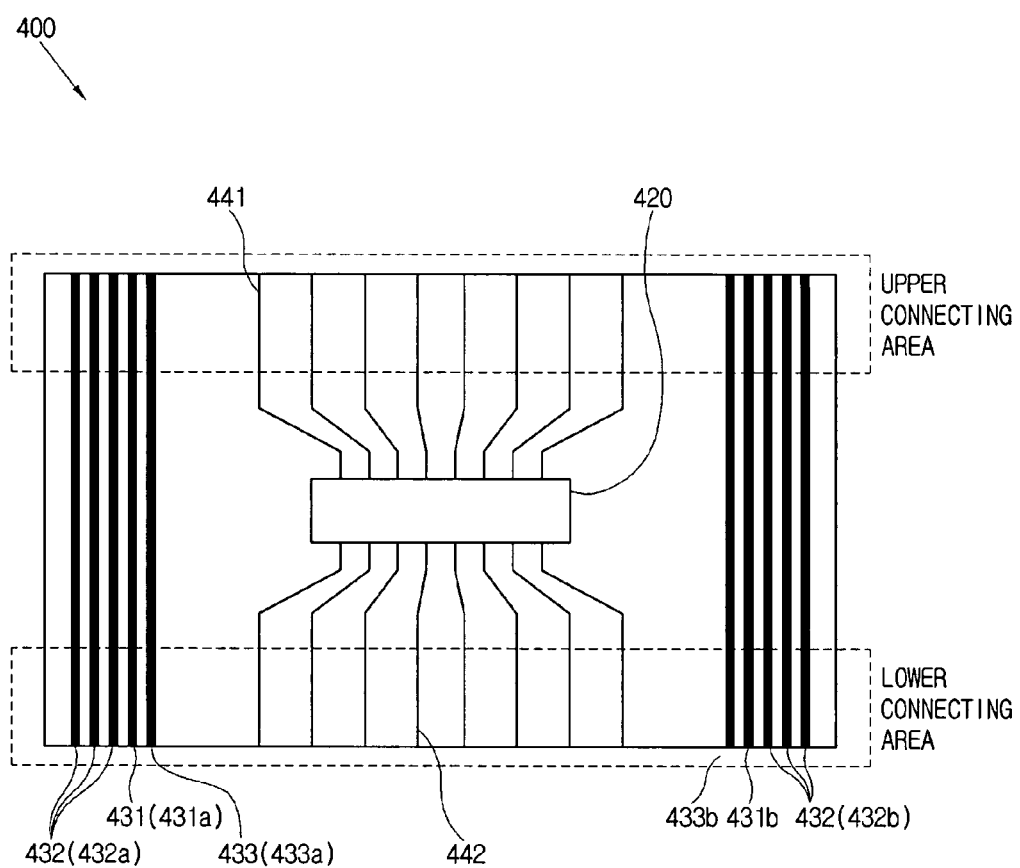
FIG. 10 is a plan view of a flexible member for use in the third embodiment of the present invention.

As shown in FIG. 10, the structure of a flexible member 400 is changed to correspond to the changed layout of the first substrate 100. Specifically, three first application leads 432a and three second application leads 432b are arranged in the flexible member 400.

According to the third embodiment, since the common voltage can be applied to more portions of a common electrode 250, uniformity of the common voltage is improved.

Hereinafter, a liquid crystal display device 1 according to a fourth embodiment of the present invention will be described with reference to FIGS. 11 to 13.

Figure 11:
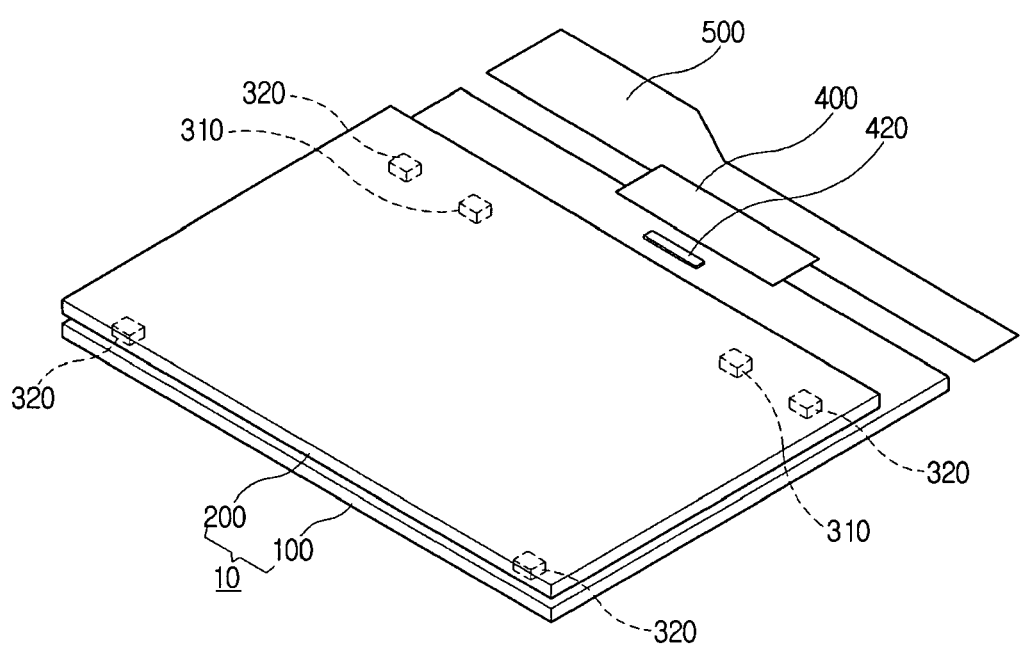
FIG. 11 is a perspective view of a liquid crystal display device according to a fourth embodiment of the present invention.

In the fourth embodiment, a driving chip 420 is mounted on the first substrate 100, as shown in FIG. 11.

Figure 12:
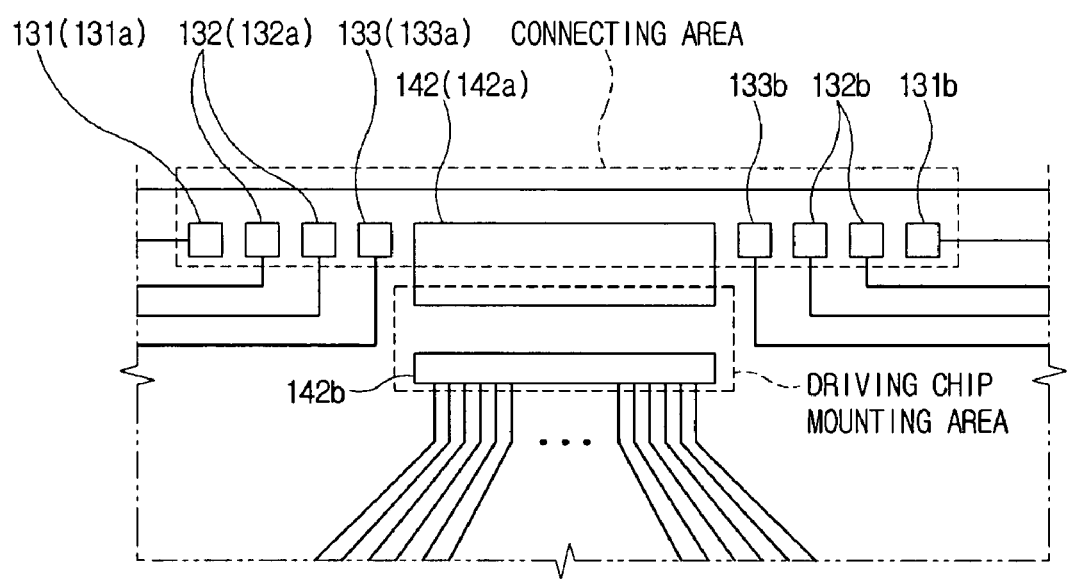
FIG. 12 shows a layout of a main portion of a first substrate according to the fourth embodiment of the present invention.
Figure 13:
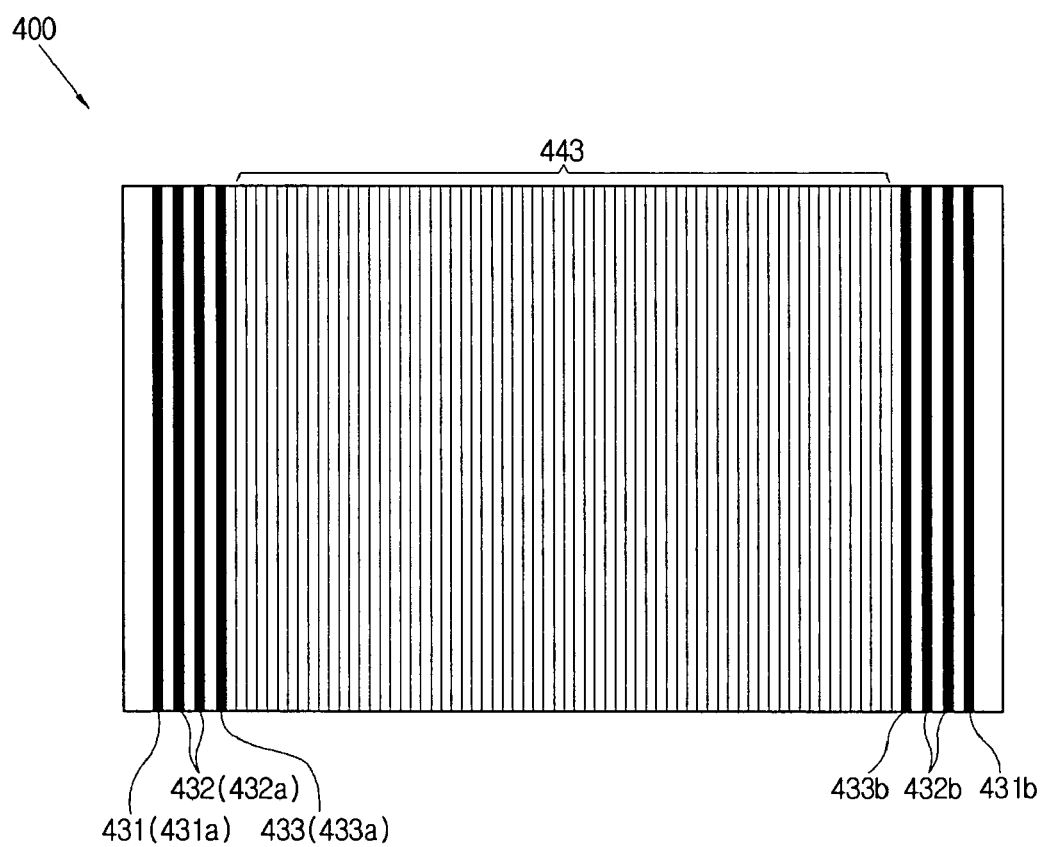
FIG. 13 is a front view of a flexible member according to the fourth embodiment of the present invention.

In addition, as shown in FIG. 12, a data pad 142 of a flexible member 400 comprises a first upper data pad 142a and a second lower data pad 142b. Data lines 141 are connected to the lower data pad 142b.

The first data pad 142a is connected to data leads 443 (shown in FIG. 13) of the flexible member 400.

The driving chip 420 receives a signal from the first data pad 142a and applies a data driving signal to the second data pad 142b.

Data leads 443 of the flexible member 400 connect a circuit board 500 to the first data pad 142a.

Although it has been illustrated in the above-described embodiments that the flexible member 400 has a bilateral symmetry, the left and right parts of flexible member 400 may not be symmetric to each other. In this case, it should be understood that a structure of the first substrate 100 is changed in correspondence to the asymmetric flexible member 400.

As apparent from the above description, the present invention provides a flexible member allowing efficient supply and compensation of a common voltage.

In addition, the present invention provides a liquid crystal display device allowing efficient supply and compensation of a common voltage.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A flexible member connection connected to a liquid crystal display (LCD) panel, the LCD panel comprising a common electrode, at least one gate line, at least one data line, a plurality of common electrode pads associated with the common electrode, a data pad associated with the data line, and at least one gate pad associated with the gate line, the flexible member comprising:
   a flexible film;
   a data lead positioned on the flexible film and electrically connected to the data pads;
   first and second application leads positioned on the flexible film and electrically connected to first predetermined ones of the plurality of common electrode pads to provide a common voltage to the common electrode;
   at least one data lead positioned on the flexible film, between the first and second application leads, and electrically connected to the data pad; and
   a feedback lead positioned on the flexible film, the feedback lead being electrically connected to a second predetermined one of the common electrode pads
   wherein the first and second application leads are electrically connected to a plurality of the first predetermined ones of the common electrode pads to provide a plurality of common voltage supply paths to the common electrode.

2. The flexible member according to claim 1, wherein the feedback lead comprises first and second feedback leads, and further wherein the data lead is located between the first and second feedback leads.

3. The flexible member according to claim 1, further comprising at least one driving chip mounted on the flexible film, wherein the at least one driving chip is electrically connected to the data lead.

4. The flexible member according to claim 1, further comprising a gate lead positioned on the flexible film and electrically connected to the at least one gate pad.

5. The flexible member according to claim 4, wherein the gate lead comprises:
   a first gate lead that is formed between the data lead and the first application lead; and
   a second gate lead that is formed between the data lead and the second application lead.

6. A liquid crystal display device comprising:
   a liquid crystal display panel comprising a common electrode, a gate line, and a data line intersecting the gate line; and
   a flexible member connected to the liquid crystal display panel, the flexible member comprising:
   a flexible film;
   first and second application leads positioned on the flexible film and electrically connected to first predetermined ones of the common electrode pads to provide a common voltage to the common electrode;
   at least one data lead positioned on the flexible film, between the first and second application leads, and electrically connected to a data pad; and
   a feedback lead positioned on the flexible film and electrically connected to a second predetermined one of the common electrode pads, wherein each of the first and second application leads has a plurality of common voltage supply paths.

7. The liquid crystal display device according to claim 6, wherein the liquid crystal display panel further comprises:
   a first substrate on which the gate line and the data line are formed; and
   a second substrate on which the common electrode is formed, the second substrate facing the first substrate, and
   wherein the flexible member is connected to the first substrate and is provided as single.

8. The liquid crystal display device according to claim 6, wherein the feedback lead comprises first and second feedback leads, and the data lead is located between the first and second feedback leads.

9. The liquid crystal display device according to claim 7, wherein the first substrate comprises a shift register that is positioned at an end of the gate line and transmits a driving signal to the gate line, and
   the flexible member further comprises a gate lead that is electrically connected to the shift register.

10. The liquid crystal display device according to claim 9, wherein the first substrate further comprises a pixel electrode that is electrically connected to the gate line and the data line,
    the shift register comprises first and second shift registers,
    the pixel electrode is located between the first and second shift registers, and
    the gate lead comprises:
    a first gate lead that is formed between the data lead and the first application lead and is electrically connected to the first shift register; and
    a second gate lead that is formed between the data lead and the second application lead and is electrically connected to the second shift register.

11. The liquid crystal display device according to claim 10, wherein the pixel electrode comprises first, second and third pixel electrodes that constitute one pixel, and further wherein the first, second and third pixel electrodes are electrically connected to different gate lines.

12. The liquid crystal display device according to claim 11, wherein two of the first, second and third pixel electrodes are electrically connected to the same data line.

13. The liquid crystal display device according to claim 11, wherein the first, second and third pixel electrodes are sequentially driven.

14. The liquid crystal display device according to claim 6, wherein the flexible member further comprises a driving chip that is mounted on the flexible film and is connected to the data lead.

15. The liquid crystal display device according to claim 6, further comprising a driving chip mounted on the first substrate, the data chip being connected to the data lead.

16. A liquid crystal display device comprising:
   a first substrate comprising a pixel electrode, a gate line, and a data line;
   a second substrate comprising a common electrode, the second substrate facing the first substrate; and
   a flexible member including leads for providing electrical connections to the first substrate, the flexible member being provided as single and is electrically connected to the data line, and the first substrate further comprising:

a data pad connected to the data line;

first and second application pads for receiving a common voltage from the flexible member, wherein the data pad is located between the first and second application pads; and first and second feedback pads electrically connected to the common electrode, wherein the data pad is located between the first and second feedback pads and each of the first and second application pads has a plurality of common voltage supply paths.

17. The liquid crystal display device according to claim 16, wherein the first substrate further comprises:

first and second shift registers that are provided at an end part of the gate line and transmits a driving signal to the gate line, with the pixel electrode located between the first and second shift registers; and first and second gate pads that receive a gate driving signal from the flexible member and apply the received gate driving signal to the first and second shift registers, respectively, wherein the first gate pad is formed between the data pad and the first application pad and the second gate pad is formed between the data pad and the second application pad.

18. The liquid crystal display device according to claim 17, wherein the pixel electrode comprises first, second and third pixel electrodes that constitute one pixel, and the first, second and third pixel electrodes are electrically connected to different gate lines.

19. The liquid crystal display device according to claim 18, wherein two of the first, second and third pixel electrodes are connected to the same data line.

20. The liquid crystal display device according to claim 18, wherein the first, second and third pixel electrodes are sequentially driven.

* * * * *